US008968867B2

(12) United States Patent
Min

(10) Patent No.: US 8,968,867 B2
(45) Date of Patent: Mar. 3, 2015

(54) HORIZONTAL THERMOELECTRIC TAPE AND METHOD FOR MANUFACTURING SAME

(71) Applicant: Solueta, Ansan, Gyeonggi-Do (KR)

(72) Inventor: Eui Hong Min, Gyeonggi-Do (KR)

(73) Assignee: Solueta, Ansan, Gyeonggi-do (KR)

( * ) Notice: Subject to any disclaimer, the term of this patent is extended or adjusted under 35 U.S.C. 154(b) by 0 days.

(21) Appl. No.: 14/065,198

(22) Filed: Oct. 28, 2013

(65) Prior Publication Data
US 2014/0050916 A1    Feb. 20, 2014

Related U.S. Application Data

(63) Continuation of application No. PCT/KR2012/003294, filed on Apr. 27, 2012.

(30) Foreign Application Priority Data

Apr. 28, 2011 (KR) .................. 10-2011-0040327
Apr. 27, 2012 (KR) .................. 10-2012-0044489

(51) Int. Cl.
*B32B 7/12* (2006.01)
*B32B 27/08* (2006.01)
*G11B 5/708* (2006.01)
(Continued)

(52) U.S. Cl.
CPC .......... *H05K 7/20481* (2013.01); *H05K 9/0084* (2013.01); *C08K 2003/321* (2013.01); *C08K 3/0058* (2013.01); *C08K 3/04* (2013.01); *C09J 7/0246* (2013.01); *C09J 7/0296* (2013.01); *C08K 2003/2227* (2013.01); *C09J 2201/602* (2013.01); *C09J 2203/326* (2013.01);
(Continued)

(58) Field of Classification Search
CPC ........ G11B 5/708; G11B 5/735; G11B 5/738; C08J 7/047; C09J 7/0246; C09J 7/0296; C09J 2433/00; B32B 7/12; B32B 27/08
USPC .................................................. 428/323, 343
See application file for complete search history.

(56) References Cited

U.S. PATENT DOCUMENTS

2008/0206544 A1* 8/2008 Kim et al. .................. 428/305.5
2010/0012884 A1* 1/2010 Nakamichi et al. ............. 252/70
(Continued)

FOREIGN PATENT DOCUMENTS

| JP | 2001-345593 A | 12/2001 |
|---|---|---|
| KR | 10-2005-0019696 A | 3/2005 |
| KR | 10-2009-0043633 A | 5/2009 |

*Primary Examiner* — Samir Shah
(74) *Attorney, Agent, or Firm* — Mintz Levin Cohn Ferris Glovsky and Popeo, P.C.; Kongsik Kim

(57) ABSTRACT

The present invention relates to a horizontal thermoelectric tape and a method for manufacturing same, and more particularly, to a horizontal thermoelectric tape for an effective blocking of an electromagnetic wave and an excellent heat dissipation effect. The horizontal thermoelectric tape of the present invention unifies the double layer structure of an adhesion layer and a heat dissipation layer, more effectively achieving the heat dissipation effect, and simplifying the manufacturing process thereof, and by using a non-evaporated metal foil as a conductive base material, enables a horizontal thermoelectric tape having an excellent heat conductivity, and using a conductive base material not containing impurities.

4 Claims, 2 Drawing Sheets

(51) Int. Cl.
  *G11B 5/735*   (2006.01)
  *G11B 5/738*   (2006.01)
  *H05K 7/20*    (2006.01)
  *H05K 9/00*    (2006.01)
  *C08K 3/32*        (2006.01)
  *C08K 3/00*        (2006.01)
  *C08K 3/04*        (2006.01)
  *C09J 7/02*        (2006.01)
  *C08K 3/22*        (2006.01)

(52) U.S. Cl.
  CPC ..... *C09J 2205/102* (2013.01); *C09J 2400/163* (2013.01); *C09J 2467/006* (2013.01); *C08K 2003/2224* (2013.01)
  USPC ............................ 428/343; 428/323; 428/355

HORIZONTAL THERMOELECTRIC TAPE AND METHOD FOR MANUFACTURING SAME

CROSS-REFERENCE TO RELATED APPLICATIONS

The present application is a continuation of International Application No. PCT/KR2012/003294 filed on Apr. 27, 2012, which claims priority to Korean Application No. 10-2011-0040327 filed on Apr. 28, 2011 and Korean Application No. 10-2012-0044489 filed on Apr. 27, 2012, which applications are incorporated herein by reference.

TECHNICAL FIELD

The present invention relates to a horizontal thermoelectric tape and a method of manufacturing the same, and more particularly, to a horizontal thermoelectric tape which is capable of effectively shielding electromagnetic waves and exhibits superior heat dissipation effects, and to a method of manufacturing the same.

BACKGROUND ART

Typical operation of electronic products generates heat from electronic elements included in the electronic products.

As such, if the heat thus generated is not dissipated outside as quickly as possible, it negatively affects the electronic elements, which undesirably deteriorates functions of the electronic elements. This heat may cause noise and malfunction of peripheral parts or devices, and the lifetime of the products may decrease.

In particular, with the trend of manufacturing electronic products having high performance and functionality while being light, slim, short and small, there is an essential need for an increase in capacity and integration of electronic elements. How to effectively dissipate heat generated from the parts of electronic products is regarded as an important factor of determining performance and quality of the products.

Conventionally, in order to solve the above problems, although heat generated from electronic elements is removed using a fin fan process, a Peltier cooling process, a water-jet cooling process, an immersion cooling process, a heat pipe cooling process, etc., electronic elements require appropriate cooling and heat dissipation units so as to be adapted for electronic products which are manufactured to be slim and small these days.

Moreover, with the recent advance of electronics and telecommunications industries, the use of notebook computers, mobile phones and so on is widespread, and thus a process of removing heat by attaching a heat dissipation tape to such products, which are lighter and slimmer, is preferred.

However, conventional heat dissipation tape products are problematic because an adhesive layer and a heat dissipation layer are separately provided, which undesirably decreases heat dissipation efficiency, and also because the manufacturing process thereof is complicated. Also, conventional heat dissipation tape products include a conductive substrate formed using a deposition process, and are disadvantageous in terms of having low heat conductivity.

SUMMARY

Accordingly, the present invention has been made keeping in mind the above problems occurring in the related art, and an object of the present invention is to provide a horizontal thermoelectric tape and a method of manufacturing the same, wherein electromagnetic waves generated from certain devices and electronic elements at predetermined positions are shielded, and heat generated therefrom is effectively removed, thus exhibiting superior heat dissipation effects and heat conductivity.

In order to accomplish the above object, an aspect of the present invention provides a horizontal thermoelectric tape, suitable for use in shielding electromagnetic waves generated from an electronic element, transferring heat generated from the electromagnetic waves to the outside and having heat conductivity, the horizontal thermoelectric tape comprising a conductive substrate 70~120 μm thick comprising a metal foil formed of at least one metal selected from the group consisting of aluminum, copper and nickel, a PET layer formed on the upper surface of the conductive substrate, and a heat dissipation adhesive layer formed on the lower surface of the conductive substrate. Also, the heat dissipation adhesive layer may be formed using an adhesive and a graphite filler.

Furthermore, the graphite filler may have a diameter of 5~15 μm. Moreover, the graphite filler may be used in an amount of 10~15 parts by weight based on 100 parts by weight of the adhesive. Also, the heat dissipation adhesive layer may further comprise a flame retardant and a hardener. The flame retardant may comprise at least one selected from the group consisting of aluminum hydroxide ($Al(OH)_3$, magnesium hydroxide ($Mg(OH)_2$) and a phosphorus-based flame retardant. The hardener may comprise at least one selected from the group consisting of isocyanate, amine and epoxy.

Another aspect of the present invention provides a method of manufacturing a horizontal thermoelectric tape, comprising applying a heat dissipation adhesive onto the lower surface of a conductive substrate having PET attached to the upper surface thereof and comprising a metal foil 70~120 μm thick formed of at least one metal selected from the group consisting of aluminum, copper and nickel, and laminating a releasable film on a surface of the heat dissipation adhesive opposite the surface thereof applied onto the conductive substrate. Also, the heat dissipation adhesive may be prepared by mixing an adhesive and a graphite filler to obtain a mixture which is then stirred. Furthermore, the graphite filler may have a diameter of 5~15 μm. Moreover, the graphite filler may be used in an amount of 10~15 parts by weight based on 100 parts by weight of the adhesive. Also, the heat dissipation adhesive may further comprise a flame retardant and a hardener. The flame retardant may comprise at least one selected from the group consisting of aluminum hydroxide ($Al(OH)_3$), magnesium hydroxide ($Mg(OH)_2$) and a phosphorus-based flame retardant. The hardener may comprise at least one selected from the group consisting of isocyanate, amine and epoxy.

According to the present invention regarding a horizontal thermoelectric tape and a method of manufacturing the same, heat generated from electronic elements can be effectively transferred and removed, and electromagnetic waves can be efficiently shielded. Specifically, the horizontal thermoelectric tape of the present invention unifies the double layer structure of a conventional horizontal thermoelectric tape including an adhesive layer and a heat dissipation layer, and is configured such that a conductive substrate is directly coated with a heat dissipation adhesive, thus increasing heat dissipation efficiency and simplifying the manufacturing process. Also, a non-deposited conductive substrate is used, resulting in a horizontal thermoelectric tape that has superior heat conductivity.

DETAILED DESCRIPTION

Figure 1:
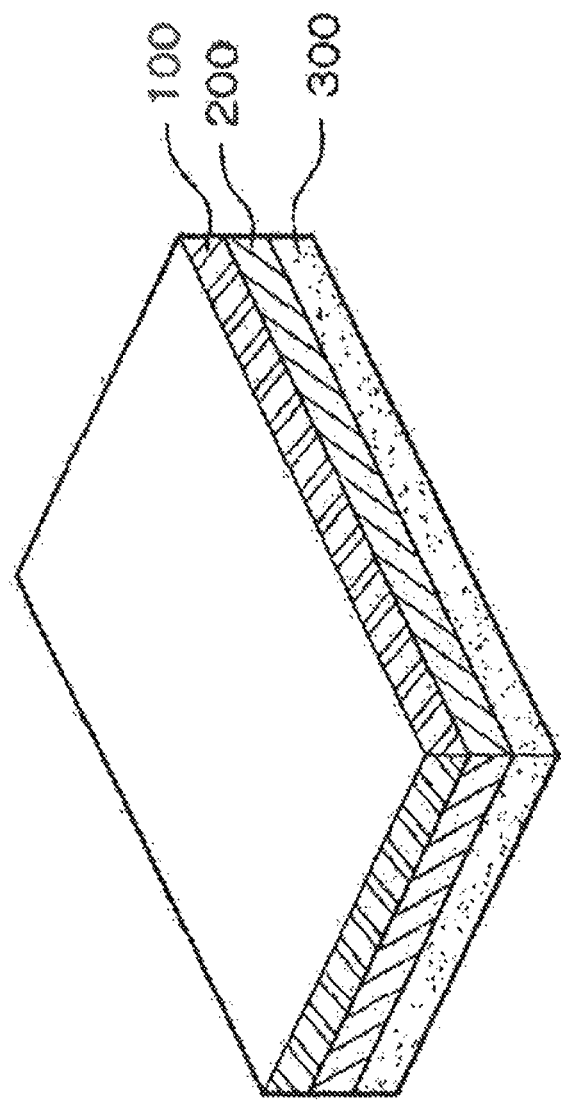
FIG. 1 is a cross-sectional view illustrating a horizontal thermoelectric tape according to the present invention.

Culminating in the present invention, intensive and thorough research carried out by the present inventors aiming to solve the problems encountered in the related art, led to development of a horizontal thermoelectric tape which unifies the double layer structure of an adhesive layer and a heat dissipation layer to form a single layer structure thus increasing heat dissipation efficiency and shielding electromagnetic waves and also in which a conductive substrate is not deposited thus exhibiting higher heat conductivity.

According to the present invention, a horizontal thermoelectric tape shields electromagnetic waves generated from electronic elements, transfers heat generated from such electromagnetic waves to the out side and has heat conductivity, and the horizontal thermoelectric tape includes a conductive substrate 70~120 µm thick comprising a metal foil formed of at least one metal selected from the group consisting of aluminum, copper and nickel, a PET layer formed on the upper surface of the conductive substrate, and a heat dissipation adhesive layer formed on the lower surface of the conductive substrate.

The thickness of the conductive substrate is preferably set to 70~120 µm. If the thickness of the conductive substrate is less than 70 µm, heat conductivity may decrease.

In contrast, if the thickness thereof exceeds 120 µm, it is difficult to finally manufacture a slim product due to the excessive thickness. Also, the conductive substrate preferably includes a metal foil, and the metal preferably includes at least one selected from the group consisting of aluminum, copper and nickel. When the metal comprising at least one selected from the group consisting of aluminum, copper and nickel is used, it may be formed into a conductive substrate without separate deposition, thereby further increasing heat conductivity. Furthermore, the conductive substrate, which is not damaged and contains no impurities, may be effectively formed, compared to when performing a deposition process.

Also, the heat dissipation adhesive layer is preferably formed from an adhesive and heat dissipation powder. The adhesive is preferably an acrylic adhesive or a silicone adhesive. In the heat dissipation adhesive layer, any material for the heat dissipation powder is not particularly limited so long as it imparts a heat dissipation effect, and preferable examples thereof include alumina and a graphite filler. Particularly useful is a graphite filler. In the case where graphite is used as the heat dissipation powder, the surface of the heat dissipation tape becomes smooth, positively affecting the outer appearance thereof and preventing damage to the heat dissipation tape itself. Also, when graphite is contained as the heat dissipation powder, the heat dissipation adhesive layer is prevented from being stripped from the conductive substrate, making it possible to provide a horizontal thermoelectric tape having higher adhesiveness. Furthermore, it is possible to provide a horizontal thermoelectric tape which is effectively maintained in adhesiveness even under external force applied to the horizontal thermoelectric tape. Although the graphite filler is not particularly limited in size, it preferably has a diameter of 5~15 µm. If the diameter thereof is less than 5 µm, heat dissipation effects may deteriorate. In contrast, if the diameter thereof exceeds 15 µm, the surface of the tape may become coarse (Example 4). The graphite filler is preferably used in an amount of 10~15 parts by weight based on 100 parts by weight of the adhesive. When the graphite filler is added in an amount less than 10 parts by weight, heat conductivity may decrease. In contrast, if the amount of the graphite filler exceeds 15 parts by weight, adhesion may decrease (Example 4).

Also, the heat dissipation adhesive layer preferably further includes a flame retardant and a hardener. The flame retardant may also be referred to as a flameproof agent, and is added to prevent combustion of the heat dissipation adhesive layer and generation of harmful gases upon combustion, and preferably includes at least one selected from the group consisting of aluminum hydroxide $Al(OH)_3$), magnesium hydroxide ($Mg(OH)_2$) and a phosphorus-based flame retardant. The hardener is used to enhance hardness of the heat dissipation adhesive layer, and preferably includes at least one selected from the group consisting of isocyanate, amine and epoxy.

In addition, according to the present invention, a method of manufacturing the horizontal thermoelectric tape includes applying a heat dissipation adhesive onto the lower surface of a conductive substrate having PET attached to the upper surface thereof and comprising a metal foil 70~120 µm thick formed of at least one metal selected from the group consisting of aluminum, copper and nickel, and laminating a releasable film on a surface of the heat dissipation adhesive opposite the surface thereof applied onto the conductive substrate.

The thickness of the metal foil of the conductive substrate is preferably set to 70~120 µm. If the thickness thereof is less than 70 µm, heat conductivity may decrease. In contrast, if the thickness thereof exceeds 120 µm, it is difficult to finally manufacture a slim product due to the excessive thickness. Also, the conductive substrate preferably includes a metal foil, and the metal preferably includes at least one selected from the group consisting of aluminum, copper and nickel. In the case where the metal comprising at least one selected from the group consisting of aluminum, copper foil and nickel is used, it may be formed into a conductive substrate without separate deposition, thus further increasing heat conductivity. Moreover, the conductive substrate, which is not damaged and contains no impurities, may be effectively formed, compared to when performing a deposition process. The heat dissipation adhesive may be prepared by mixing an adhesive and heat dissipation powder and stirring the mixture. The adhesive is preferably composed of an acrylic adhesive or a silicone adhesive. The heat dissipation powder may include at least one selected from the group consisting of a graphite filler, alumina, ceramic and carbon nanotubes. Particularly useful is a graphite filler. Although the graphite filler is not particularly limited in size, it preferably has a diameter of 5~15 µm. If the diameter thereof is less than 5 µm, heat dissipation effects may deteriorate. In contrast, if the diameter thereof exceeds 15 µm, the surface of the tape may become coarse (Example 4). The graphite filler is preferably used in an amount of 10~15 parts by weight based on 100 parts by weight of the adhesive. If the amount of the graphite filler is less than 10 parts by weight, heat conductivity may decrease. In contrast, if the amount thereof exceeds 15 parts by weight, adhesion may decrease (Example 4).

Also, the heat dissipation adhesive layer preferably further includes a flame retardant and a hardener. The flame retardant may also be referred to as a flameproof agent, and is added to prevent combustion of the heat dissipation adhesive layer and generation of harmful gases upon combustion, and preferably includes at least one selected from the group consisting of aluminum hydroxide ($Al(OH)_3$), magnesium hydroxide ($Mg(OH)_2$) and a phosphorus-based flame retardant. The hardener is added to enhance hardness of the heat dissipation adhesive layer, and preferably includes at least one selected from the group consisting of isocyanate, amine and epoxy.

A better understanding of the present invention may be obtained through the following examples which are set forth to illustrate, but are not to be construed to limit the present invention.

EXAMPLES

Example 1

Use of Metal Foil as Conductive Substrate 100 parts by weight of an acrylic adhesive having a solid content of 45% was mixed with 11.1 parts by weight of a graphite filler having a diameter of 5~15 μm as heat dissipation powder, and the mixture was uniformly dispersed using a high-speed stirrer for about 30~60 min. Upon stirring, aluminum hydroxide as a flame retardant and an amine-based hardener were added. The resulting mixture was then stabilized at room temperature of about 20~30° C. for about 30~60 min so as to be defoamed, thus preparing a heat dissipation adhesive.

As a conductive substrate, a non-deposited metal foil 100 μm thick comprising an aluminum product (Metal foil SAM-HWA, HANWHA aluminum product) was used. Furthermore, PET was attached to the upper surface of the conductive substrate.

Subsequently, the heat dissipation adhesive was applied onto the conductive substrate using a comma coater. As such, because the coating thickness is decreased due to evaporation of the solvent after drying, a coating was formed to be thicker by at least 40% than a desired thickness. Thereafter, the coated substrate was allowed to stand and aged at 40~60° C. for 24 hr in a chamber so that the polymer of the heat dissipation adhesive was stabilized. Then, a releasable film was laminated on the conductive substrate so that a horizontal thermoelectric tape was usable in a state of being attached to a predetermined target. A final horizontal thermoelectric tape was configured such that the heat dissipation adhesive was 35 μm thick, the conductive substrate was 100 μm thick, and the PET coating layer including a bonding layer was 15 μm thick, resulting in a total thickness of 150 μm. FIG. 1 illustrates the horizontal thermoelectric tape of Example 1 configured such that the PET layer is provided on the upper surface of the conductive substrate and the heat dissipation adhesive layer is provided on the lower surface of the conductive substrate. In FIG. 1, the reference numeral 100 designates a PET layer, the reference numeral 200 designates a conductive substrate including a metal foil, and the reference numeral 300 designates a heat dissipation adhesive layer.

Example 2

Use of Alumina as Heat Dissipation Powder

A horizontal thermoelectric tape was manufactured in the same manner as in Example 1, with the exception that alunina was used as the heat dissipation powder.

Example 3

Use of 8.8 Parts by Weight of Graphite Filler Based on 100 Parts by Weight of Acrylic Adhesive A horizontal thermoelectric tape was manufactured in the same manner as in Example 1, with the exception that the graphite filler was used in an amount of 8.8 parts by weight based on 100 parts by weight of the acrylic adhesive.

Example 4

Use of 16.6 Parts by Weight of Graphite Filler Based on 100 Parts by Weight of Acrylic Adhesive A horizontal thermoelectric tape was manufactured in the same manner as in Example 1, with the exception that the graphite filler was used in an amount of 16.6 parts by weight based on 100 parts by weight of the acrylic adhesive.

COMPARATIVE EXAMPLES

Comparative Example 1

Use of Deposited Conductive Substrate

A horizontal thermoelectric tape was manufactured in the same manner as in Example 1, with the exception that a conductive substrate having a thickness of 1~1.5 μm, resulting from depositing an aluminum product 100 μm thick at a deposition rate of 1.6 m/min while supplying vapor in a vacuum at 70° C., was used.

Comparative Example 2

Use of Metal Foil 50 μm Thick

A horizontal thermoelectric tape was manufactured in the same manner as in Example 1, with the exception that aluminum 50 μm thick was used as the metal foil.

TEST EXAMPLES

Test Example 1

Measurement of Heat Conductivity of Example 1 and Comparative Example 1

Measurement of heat conductivity of Example 1 using the non-deposited metal foil comprising aluminum as the conductive substrate and Comparative Example 1 using the deposited conductive substrate was performed by the external agency (KAIST (Korea Advanced Institute of Science and Technology)). This measurement was carried out using a laser flash method. Also, a measurement instrument was LFA available from NETZSCH. The results are shown in Table 1 below.

TABLE 1

| | Heat Conductivity (W/mK) |
|---|---|
| Ex. 1 | 100 |
| Comp. Ex. 1 | 0.7 |

As is apparent from Table 1, in Comparative Example 1 wherein the horizontal thermoelectric tape was manufactured using the conductive substrate obtained by performing a deposition process, heat conductivity was much lower than in Example 1 without performing a deposition process. Hence, the use of the non-deposited conductive substrate as in Example 1 considerably increases heat conductivity compared to when using the deposited conductive substrate as in Comparative Example 1.

Test Example 2

Measurement of Heat Conductivity Depending on the Type of Heat Dissipation Powder Measurement of heat conductivity of Example 1 using a graphite filler as the heat dissipation powder and Example 2 using alumina was performed. This measurement was carried out by the Center for Instrumental Analysis in Ajou University, Korea, and the rest of experiments were performed in the same manner as in Test Example 1. The results are shown in Table 2 below.

TABLE 2

|  | Heat Conductivity (W/mK) | Adhesion (gf/25 mm) |
| --- | --- | --- |
| Ex. 1 | 100 | 1600~1700 |
| Ex. 2 | 79 | 1400~1500 |

As is apparent from Table 2, Example 1 using the graphite filler as the heat dissipation powder exhibited higher heat conductivity than Example 2 using alumina. Furthermore, Example 1 using the graphite filler manifested superior adhesion to Example 2 using alumina.

Test Example 3

Measurement of Heat Conductivity and Adhesion Depending on the Amount of Graphite Filler Changes in heat conductivity were measured depending on changes in the amount of graphite filler in Examples 1, 3 and 4. This measurement was carried out in the same manner as in Test Example 1. The results are shown in Table 3 below.

TABLE 3

|  | Heat Conductivity (W/mK) | Adhesion (gf/25 mm) |
| --- | --- | --- |
| Ex. 1 | 100 | 1600~1700 |
| Ex. 2 | 88 | 1700~1800 |
| Ex. 3 | 11 | 800~900 |

As is apparent from Table 3, compared to Example 1, Example 3 exhibited higher adhesion but lower heat conductivity, and heat conductivity was improved but adhesion was decreased in Example 4. Therefore, Example 1 is regarded as the most preferable because both heat conductivity and adhesion are superior.

Test Example 4

Measurement of Heat Conductivity Depending on Changes in Thickness of Metal Foil Heat conductivity was measured in the same manner as in Test Example 1 using the metal foils comprising aluminum 100 μm thick in Example 1 and aluminum 50 μm thick in Comparative Example 2. The results are shown in Table 4 below.

TABLE 4

|  | Heat Conductivity (W/mK) |
| --- | --- |
| Ex. 1 | 100 |
| Comp. Ex. 2 | 58.836 |

As is apparent from Table 4, heat conductivity was much lower in Comparative Example 2 at a thickness of 50 μm than in Example 1.

Test Example 5

Shielding of Electromagnetic Waves

The effect of Example 1 on shielding electromagnetic waves was measured, wherein, in Example 1, the non-deposited metal foil comprising aluminum was used as the conductive substrate, and the amount of the graphite filler serving as the heat dissipation powder was 11.1 parts by weight based on the acrylic adhesive. This measurement was carried out by EMC (Electromagnetic Capability) Research Institute in Korea according to electromagnetic wave shielding standards [KS C 0304]. As measurement instruments, a Network Spectrum Impedance Analyzer (brand name: 4396B, available from Agilent, measurement range: 0.1 kHz~1.8 GHz) and Shielding Effectiveness test Fixture (brand name: EM-2107A, available from Electo-Metrics Co. Ltd., measurement range: 30~1500 MHz) were used. The results are shown in FIG. 2.

Figure 2:
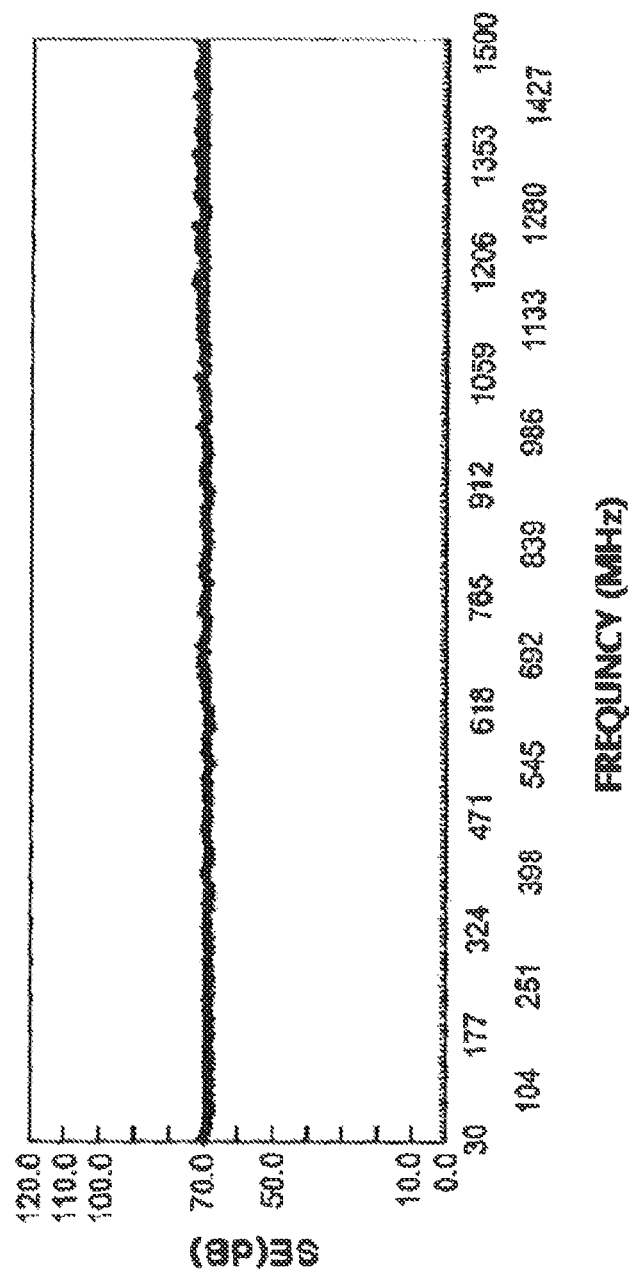
FIG. 2 is a graph illustrating the results of measurement of effects of the horizontal thermoelectric tape according to the present invention on shielding electromagnetic waves.

FIG. 2 illustrates the electromagnetic wave shielding performance of Example 1 approximating to 70 dB.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A horizontal thermoelectric tape, suitable for use in shielding electromagnetic waves generated from an electronic element, transferring heat generated from the electromagnetic waves to outside and having heat conductivity, the horizontal thermoelectric tape comprising:
    (a) a conductive substrate comprising a metal foil formed of aluminum;
    (b) a PET layer formed on an upper surface of the conductive substrate; and
    (c) a heat dissipation adhesive layer formed on a lower surface of the conductive substrate,
    wherein the heat dissipation adhesive layer is formed using an acrylic adhesive and a graphite filler, and the graphite filler is used in an amount of 11.1~15 parts by weight based on 100 parts by weight of the acrylic adhesive,
    wherein the graphite filler has a diameter of 5~15 μm,
    wherein the thickness ratio of the conductive substrate to the heat dissipation adhesive layer to the PET layer is 100 μm:35 μm:15 μm, and
    wherein heat conductivity of the horizontal thermoelectric tape is 100 (W/Mk) and adhesion of the horizontal thermoelectric tape is 1600~1700 gf/25 mm.

2. The horizontal thermoelectric tape of claim 1, wherein the heat dissipation adhesive layer further comprises a flame retardant and a hardener.

3. The horizontal thermoelectric tape of claim 2, wherein the flame retardant comprises at least one selected from the group consisting of aluminum hydroxide (AlOH), magnesium hydroxide (MgOH) and a phosphorus-based flame retardant.

4. The horizontal thermoelectric tape of claim 2, wherein the hardener comprises at least one selected from the group consisting of isocyanate, amine and epoxy.

* * * * *